(12) United States Patent
Chang et al.

(10) Patent No.: US 12,087,718 B2
(45) Date of Patent: Sep. 10, 2024

(54) BUMP STRUCTURE HAVING A SIDE RECESS AND SEMICONDUCTOR STRUCTURE INCLUDING THE SAME

(71) Applicant: Taiwan Semiconductor Manufacturing Company, Ltd., Hsin-Chu (TW)

(72) Inventors: Chih-Horng Chang, Taipei (TW);
Tin-Hao Kuo, Hsinchu (TW);
Chen-Shien Chen, Zhubei (TW);
Yen-Liang Lin, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/300,493

(22) Filed: Apr. 14, 2023

(65) Prior Publication Data

US 2023/0253355 A1 Aug. 10, 2023

Related U.S. Application Data

(60) Division of application No. 17/075,904, filed on Oct. 21, 2020, now Pat. No. 11,631,648, which is a
(Continued)

(51) Int. Cl.
*H01L 23/00* (2006.01)
*H01L 25/00* (2006.01)

(52) U.S. Cl.
CPC .............. *H01L 24/13* (2013.01); *H01L 24/11* (2013.01); *H01L 24/14* (2013.01); *H01L 24/16* (2013.01);
(Continued)

(58) Field of Classification Search
None
See application file for complete search history.

(56) References Cited

U.S. PATENT DOCUMENTS

| 5,477,086 A | 12/1995 | Rostoker et al. |
| 5,558,271 A | 9/1996 | Rostoker et al. |
| | (Continued) | |

FOREIGN PATENT DOCUMENTS

JP 2014017454 A * 1/2014 ............. H01L 24/13

OTHER PUBLICATIONS

Notice of Allowance dated May 30, 2014 for U.S. Appl. No. 13/192,302.
(Continued)

*Primary Examiner* — Scott B Geyer
(74) *Attorney, Agent, or Firm* — Eschweiler & Potashnik, LLC

(57) ABSTRACT

The present disclosure relates to an integrated chip structure having a first substrate including a plurality of transistor devices disposed within a semiconductor material. An interposer substrate includes vias extending through a silicon layer. A copper bump is disposed between the first substrate and the interposer substrate. The copper bump has a sidewall defining a recess. Solder is disposed over the copper bump and continuously extending from over the copper bump to within the recess. A conductive layer is disposed between the first substrate and the interposer substrate and is separated from the copper bump by the solder.

20 Claims, 16 Drawing Sheets

Related U.S. Application Data continuation of application No. 16/458,324, filed on Jul. 1, 2019, now Pat. No. 10,833,033, which is a continuation of application No. 15/803,008, filed on Nov. 3, 2017, now Pat. No. 10,388,622, which is a continuation of application No. 15/353,197, filed on Nov. 16, 2016, now Pat. No. 9,824,992, which is a continuation of application No. 15/057,302, filed on Mar. 1, 2016, now Pat. No. 9,520,379, which is a continuation of application No. 14/800,934, filed on Jul. 16, 2015, now Pat. No. 9,318,458, which is a continuation of application No. 14/507,189, filed on Oct. 6, 2014, now Pat. No. 9,105,533, which is a continuation-in-part of application No. 13/192,302, filed on Jul. 27, 2011, now Pat. No. 8,853,853.

(52) U.S. Cl.
CPC .............. *H01L 24/81* (2013.01); *H01L 25/50* (2013.01); *H01L 2224/0401* (2013.01); *H01L 2224/05552* (2013.01); *H01L 2224/05572* (2013.01); *H01L 2224/05599* (2013.01); *H01L 2224/10145* (2013.01); *H01L 2224/11849* (2013.01); *H01L 2224/13011* (2013.01); *H01L 2224/13012* (2013.01); *H01L 2224/13015* (2013.01); *H01L 2224/13018* (2013.01); *H01L 2224/13082* (2013.01); *H01L 2224/13083* (2013.01); *H01L 2224/131* (2013.01); *H01L 2224/13147* (2013.01); *H01L 2224/14051* (2013.01); *H01L 2224/1412* (2013.01); *H01L 2224/14152* (2013.01); *H01L 2224/14153* (2013.01); *H01L 2224/16056* (2013.01); *H01L 2224/16059* (2013.01); *H01L 2224/16238* (2013.01); *H01L 2224/81191* (2013.01); *H01L 2224/81345* (2013.01); *H01L 2224/81815* (2013.01); *H01L 2924/01322* (2013.01); *H01L 2924/2064* (2013.01); *H01L 2924/384* (2013.01); *Y10T 428/12493* (2015.01); *Y10T 428/24479* (2015.01)

(56) References Cited

U.S. PATENT DOCUMENTS

| | | | |
|---|---|---|---|
| 5,569,964 A | 10/1996 | Ikebe | |
| 5,640,052 A | 6/1997 | Tsukamoto | |
| 5,767,580 A | 6/1998 | Rostoker | |
| 5,959,355 A | 9/1999 | Petit | |
| 6,007,349 A | 12/1999 | Distefano et al. | |
| 6,037,667 A | 3/2000 | Hembree et al. | |
| 6,137,184 A * | 10/2000 | Ikegami | H01L 21/563 257/781 |
| 6,166,334 A * | 12/2000 | Galloway | B23K 3/0623 438/618 |
| 6,205,660 B1 | 3/2001 | Fjelstad et al. | |
| 6,229,711 B1 * | 5/2001 | Yoneda | H01L 24/81 174/541 |
| 6,551,859 B1 | 4/2003 | Lee et al. | |
| 6,562,545 B1 | 5/2003 | Hembree et al. | |
| 6,624,512 B2 | 9/2003 | Kurusu | |
| 6,830,959 B2 | 12/2004 | Estacio | |
| 7,057,292 B1 | 6/2006 | Elenius et al. | |
| 7,271,483 B2 | 9/2007 | Lin et al. | |
| 7,800,225 B2 | 9/2010 | Choi | |
| 8,227,332 B2 | 7/2012 | Coffy et al. | |
| 8,288,871 B1 | 10/2012 | Shieh et al. | |
| 8,299,367 B2 | 10/2012 | Ni et al. | |
| 8,304,339 B2 * | 11/2012 | Lin | H01L 24/11 257/E23.032 |
| 8,462,516 B2 * | 6/2013 | Wong | H01L 24/81 361/767 |
| 8,519,543 B1 * | 8/2013 | Song | H01L 24/17 257/774 |
| 8,709,935 B2 | 4/2014 | Choi et al. | |
| 8,723,318 B2 * | 5/2014 | Haba | H01L 24/11 438/108 |
| 8,729,699 B2 * | 5/2014 | Tu | H01L 23/49811 257/737 |
| 8,853,853 B2 | 10/2014 | Chang et al. | |
| 8,970,033 B2 | 3/2015 | Chen et al. | |
| 9,024,439 B2 | 5/2015 | Hwang et al. | |
| 9,105,533 B2 | 8/2015 | Chang et al. | |
| 9,159,686 B2 * | 10/2015 | Chen | H01L 24/05 |
| 9,472,524 B2 * | 10/2016 | Chen | H01L 24/05 |
| 9,478,513 B2 | 10/2016 | Chen et al. | |
| 9,520,379 B2 | 12/2016 | Chang et al. | |
| 9,978,667 B2 * | 5/2018 | Gerber | H01L 23/4952 |
| 2002/0011677 A1 * | 1/2002 | Yokoi | H01L 24/13 257/E23.021 |
| 2002/0125043 A1 * | 9/2002 | Yoshida | H05K 1/111 174/250 |
| 2003/0052156 A1 | 3/2003 | Kim et al. | |
| 2004/0134974 A1 * | 7/2004 | Oh | H01L 21/2885 228/180.1 |
| 2007/0045812 A1 * | 3/2007 | Heng | H01L 24/13 257/E21.511 |
| 2007/0048896 A1 | 3/2007 | Andry et al. | |
| 2007/0200234 A1 | 8/2007 | Gerber et al. | |
| 2008/0073783 A1 | 3/2008 | Matsushima et al. | |
| 2008/0088016 A1 | 4/2008 | Ho et al. | |
| 2008/0169559 A1 * | 7/2008 | Yang | H01L 24/11 257/E21.294 |
| 2009/0032915 A1 * | 2/2009 | Cherian | H01L 23/49555 257/E21.507 |
| 2009/0056985 A1 * | 3/2009 | Hirano | H05K 3/3485 174/255 |
| 2009/0098723 A1 | 4/2009 | Yu | |
| 2009/0146303 A1 | 6/2009 | Kwon | |
| 2009/0243006 A1 | 10/2009 | Takahashi et al. | |
| 2009/0256257 A1 | 10/2009 | Daubenspeck et al. | |
| 2010/0044416 A1 | 2/2010 | Ogawa | |
| 2010/0187688 A1 | 7/2010 | Hochstenbach | |
| 2010/0193944 A1 | 8/2010 | Castro et al. | |
| 2010/0246150 A1 | 9/2010 | Wong et al. | |
| 2010/0326715 A1 | 12/2010 | Lee et al. | |
| 2011/0001250 A1 | 1/2011 | Lin et al. | |
| 2011/0035925 A1 * | 2/2011 | Marion | H01L 25/0657 29/428 |
| 2011/0133334 A1 * | 6/2011 | Pendse | H01L 24/97 257/737 |
| 2011/0140271 A1 * | 6/2011 | Daubenspeck | H01L 24/81 257/738 |
| 2011/0241201 A1 | 10/2011 | Wang et al. | |
| 2011/0248399 A1 | 10/2011 | Pendse | |
| 2011/0260321 A1 | 10/2011 | Pendse | |
| 2011/0285013 A1 * | 11/2011 | Chuang | H01L 24/13 257/737 |
| 2011/0291262 A1 * | 12/2011 | Shen | H01L 24/03 257/737 |
| 2011/0304058 A1 * | 12/2011 | Pendse | H05K 3/3452 438/126 |
| 2012/0007228 A1 | 1/2012 | Lu et al. | |
| 2012/0032325 A1 | 2/2012 | Miyata et al. | |
| 2012/0074578 A1 | 3/2012 | Kobayashi et al. | |
| 2012/0091584 A1 * | 4/2012 | Kim | H01L 24/16 257/738 |
| 2012/0098120 A1 * | 4/2012 | Yu | H01L 24/13 257/737 |
| 2012/0153449 A1 | 6/2012 | Chou | |
| 2012/0252168 A1 * | 10/2012 | Nah | H01L 21/4853 257/E21.502 |
| 2012/0306104 A1 | 12/2012 | Choi et al. | |
| 2013/0001778 A1 | 1/2013 | Shieh et al. | |
| 2013/0020698 A1 | 1/2013 | Hsieh et al. | |
| 2013/0020711 A1 * | 1/2013 | Bao | H01L 24/16 257/773 |
| 2013/0026622 A1 | 1/2013 | Chuang et al. | |

(56) References Cited

U.S. PATENT DOCUMENTS

| | | | |
|---|---|---|---|
| 2013/0062755 A1* | 3/2013 | Kuo | H01L 24/14 257/737 |
| 2013/0087906 A1 | 4/2013 | Cheng et al. | |
| 2013/0134594 A1 | 5/2013 | Machida | |
| 2013/0146872 A1 | 6/2013 | Chen et al. | |
| 2013/0147030 A1 | 6/2013 | Chang et al. | |
| 2013/0187277 A1* | 7/2013 | Chen | H01L 24/05 257/762 |
| 2013/0193593 A1* | 8/2013 | Lin | H01L 24/13 257/737 |
| 2013/0241071 A1* | 9/2013 | Hsieh | H01L 24/11 257/E23.068 |
| 2013/0270693 A1 | 10/2013 | Tseng et al. | |
| 2013/0270694 A1 | 10/2013 | Hwang et al. | |
| 2013/0277838 A1* | 10/2013 | Yu | H01L 24/02 257/737 |
| 2013/0313707 A1* | 11/2013 | Choi | H01L 24/05 257/738 |
| 2014/0012764 A1 | 1/2014 | Kruglick | |
| 2014/0027900 A1 | 1/2014 | Chiu et al. | |
| 2014/0035125 A1* | 2/2014 | Kuo | H01L 24/13 257/737 |
| 2014/0084428 A1 | 3/2014 | Hedler et al. | |
| 2014/0124929 A1 | 5/2014 | Lin et al. | |
| 2014/0166194 A1* | 6/2014 | Hu | G03F 7/0002 228/264 |
| 2014/0167253 A1 | 6/2014 | Tseng et al. | |
| 2014/0182912 A1 | 7/2014 | Lin et al. | |
| 2014/0217580 A1 | 8/2014 | Myung et al. | |
| 2014/0246783 A1 | 9/2014 | Nishizawa et al. | |
| 2014/0252608 A1 | 9/2014 | Chen et al. | |
| 2014/0361432 A1 | 12/2014 | Hsieh et al. | |
| 2014/0361445 A1* | 12/2014 | Nashida | H05K 3/32 257/782 |
| 2015/0054178 A1* | 2/2015 | Ishii | H01L 24/13 257/778 |
| 2015/0061116 A1* | 3/2015 | Lu | H01L 23/49811 257/737 |
| 2015/0115422 A1 | 4/2015 | Jeon et al. | |
| 2015/0115426 A1* | 4/2015 | Lee | H01L 23/49811 257/676 |
| 2015/0123266 A1* | 5/2015 | Wu | H01L 23/49894 257/737 |
| 2015/0130051 A1 | 5/2015 | Huang et al. | |
| 2015/0179622 A1* | 6/2015 | Karhade | H01L 23/49816 257/737 |
| 2015/0187719 A1* | 7/2015 | Lin | H01L 24/16 257/737 |
| 2015/0228587 A1 | 8/2015 | Cheng et al. | |
| 2015/0279794 A1* | 10/2015 | Topacio | H01L 24/08 257/737 |
| 2015/0287688 A1 | 10/2015 | Lin et al. | |
| 2015/0294949 A1 | 10/2015 | Lin et al. | |
| 2015/0303159 A1 | 10/2015 | Lin et al. | |

OTHER PUBLICATIONS

Notice of Allowance dated Apr. 7, 2015 for U.S. Appl. No. 14/507,189.
Non-Final Office Action dated Aug. 21, 2015 for U.S. Appl. No. 14/800,934.
Notice of Allowance dated Dec. 14, 2015 for U.S. Appl. No. 14/800,934.
Non-Final Office Action dated May 23, 2016 for U.S. Appl. No. 15/057,302.
Notice of Allowance dated Aug. 10, 2016 for U.S. Appl. No. 15/057,302.
Notice of Allowance dated Jul. 7, 2017 for U.S. Appl. No. 15/353,197.
Non-Final Office Action dated Jul. 2, 2018 for U.S. Appl. No. 15/803,008.
Non-Final Office Action dated Oct. 30, 2018 for U.S. Appl. No. 15/803,008.
Non-Final Office Action dated Mar. 13, 2019 for U.S. Appl. No. 15/803,008.
Notice of Allowance dated Jun. 12, 2019 for U.S. Appl. No. 15/803,008.
Non-Final Office Action dated Mar. 10, 2020 for U.S. Appl. No. 16/458,324.
Notice of Allowance dated Jul. 2, 2020 for U.S. Appl. No. 16/458,324.
Notice of Allowance dated Dec. 16, 2022 for U.S. Appl. No. 17/075,904.

\* cited by examiner

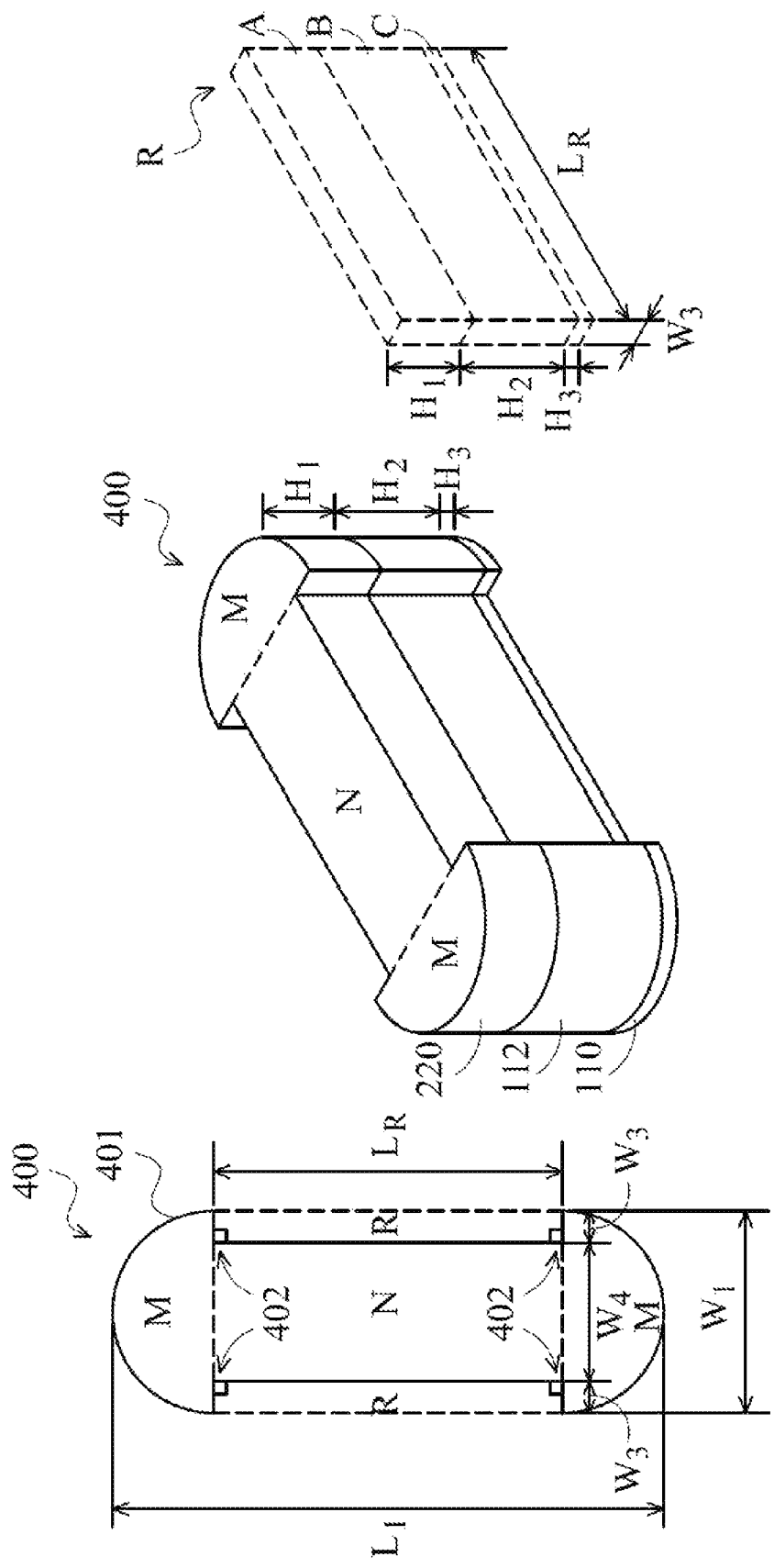

BUMP STRUCTURE HAVING A SIDE RECESS AND SEMICONDUCTOR STRUCTURE INCLUDING THE SAME

REFERENCE TO RELATED APPLICATIONS

This Application is a Divisional of U.S. application Ser. No. 17/075,904, filed on Oct. 21, 2020, which is a Continuation of U.S. application Ser. No. 16/458,324, filed on Jul. 1, 2019 (now U.S. Pat. No. 10,833,033, issued on Nov. 10, 2020), which is a Continuation of U.S. application Ser. No. 15/803,008, filed on Nov. 3, 2017 (now U.S. Pat. No. 10,388,622, issued on Aug. 20, 2019), which is a Continuation of U.S. application Ser. No. 15/353,197, filed on Nov. 16, 2016 (now U.S. Pat. No. 9,824,992, issued on Nov. 21, 2017), which is a Continuation of U.S. application Ser. No. 15/057,302, filed on Mar. 1, 2016 (now U.S. Pat. No. 9,520,379, issued on Dec. 13, 2016), which is a Continuation of U.S. application Ser. No. 14/800,934, filed on Jul. 16, 2015 (now U.S. Pat. No. 9,318,458, issued on Apr. 19, 2016), which is a Continuation of U.S. application Ser. No. 14/507,189, filed on Oct. 6, 2014 (now U.S. Pat. No. 9,105,533, issued on Aug. 11, 2015), which is a Continuation-in-Part of U.S. application Ser. No. 13/192,302, filed on Jul. 27, 2011 (now U.S. Pat. No. 8,853,853, issued on Oct. 7, 2014). The contents of the above-referenced matters are hereby incorporated by reference in their entirety.

BACKGROUND

Bump-on-Trace (BOT) structures have been used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is relatively low. However, there are technical challenges related to BOT structures.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 4A-4E illustrate various embodiments of metal bumps with recess regions to reduce solder protrusion, in accordance with some embodiments.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figures 1A, 1B:
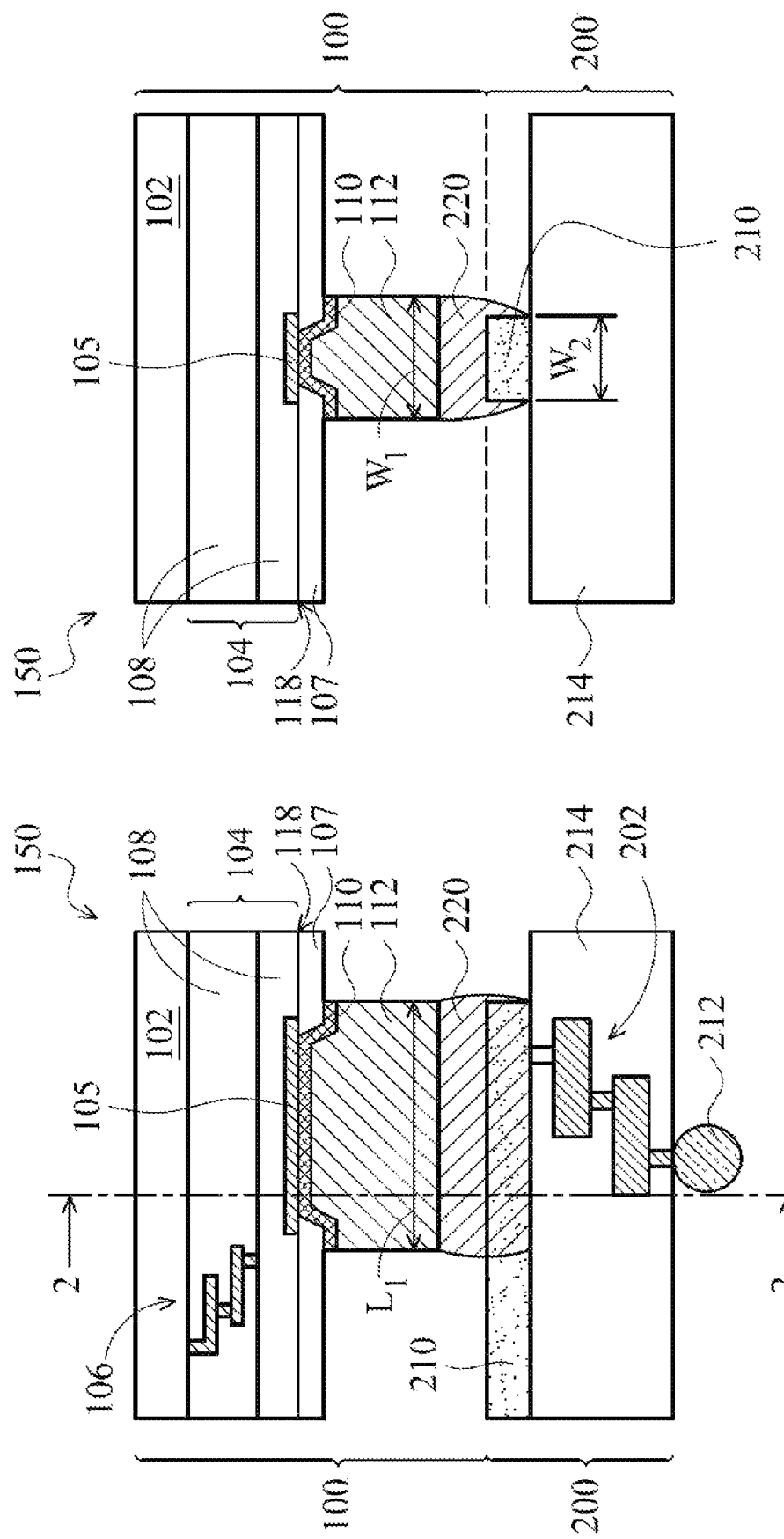
FIGS. 1A and 1B illustrate cross-sectional views of a package structure in accordance with an embodiment.

Cross-sectional views of a package structure comprising a Bump-on-Trace (BOT) structure 150 is provided in FIGS. 1A and 1B, in accordance with some embodiments. The package structure 150 includes work piece 100 bonded to work piece 200. Work piece 100 may be a device die that includes active devices such as transistors (not shown) therein, although work piece 100 may also be an interposer that does not have active devices therein. In an embodiment wherein work piece 100 is a device die, substrate 102 may be a semiconductor substrate such as a silicon substrate, although it may include other semiconductor materials. Interconnect structure 104, which includes metal lines and vias 106 formed therein and connected to the semiconductor devices, is formed on substrate 102. Metal lines and vias 106 may be formed of copper or copper alloys, and may be formed using damascene processes. Interconnect structure 104 may include a commonly known inter-layer dielectric (ILD, not shown) and inter-metal dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5.

Work piece 100 may further include under-bump metallurgy (UBM) layer 110 and a copper post (or pillar) 112 on UBM layer 110. Throughout the description, the copper post 112 is also referred to as a copper-containing bump or metal bump. Although copper post 112 is used as an example in the description here and below, other types of metal bumps, such as solder bumps, may also be used in place of copper post 112. The UBM layer 110 is disposed on a metal pad 105, which is part of interconnect structure 104. Between the interconnect structure 104 and the UBM layer 110 not contacting the metal pad 105, there is a passivation layer 107. In some embodiments, the passivation layer 107 is made of polyimide.

Work piece 200 may be a package substrate, although it may be other package components such as interposers, for example. Work piece 200 may include metal lines and vias 202 connecting metal features on opposite sides of work piece 200. In an embodiment, metal trace(s) 210 on the topside of work piece 200 is electrically connected to ball grid array (BGA) balls 212 on the bottom side of work pieces 200 through metal lines and vias 202. Metal lines and vias 202 may be formed in dielectric layers 214, although they may also be formed in a semiconductor layer (such as a silicon layer, not shown) and in the dielectric layers that are formed on the semiconductor layer.

Metal trace 210 is formed over a top dielectric layer in dielectric layers 214. Metal trace 210 may be formed of substantially pure copper, aluminum copper, or other metallic materials such as tungsten, nickel, palladium, gold, and/or alloys thereof. FIG. 1A shows that the copper post (or metal bump) 112 has a length of $L_1$, in accordance with some embodiments. Work pieces 100 and 200 are bonded to each other through solder layer 220, which may be formed of a lead-free solder, a eutectic solder, or the like. Solder layer 220 is bonded to, and contacts, the top surfaces of metal trace 210 and copper post 112.

FIG. 1B illustrates a cross-sectional view of the package structure 150 shown in FIG. 1A, wherein the cross-sectional view is obtained from the plane crossing line 2-2 in FIG. 1A. As shown in FIG. 1B, solder layer 220 may also contact the sidewalls of metal trace 210 after solder reflow. The reflowed solder layer 220 may also move along surfaces 113 of copper post 112 and cover portions or all of surfaces 113 (not shown). In some embodiments, there is a capping layer between copper post 112 and solder layer 220. The capping layer could be used to prevent the formation of inter-metallic compound(s) from copper and solder. In some embodiments, the capping layer includes nickel (Ni). Exemplary details of materials and processes used in forming work piece 100 are described in U.S. application Ser. No. 13/095,185, entitled "REDUCED-STRESS BUMP-ON-TRACE (BOT) STRUCTURES," filed on Apr. 27, 2011, which is incorporated herein by reference in its entirety.

After the bonding of work pieces 100 and 200, a mold underfill (MUF) (not shown) may be filled into the space between work pieces 100 and 200, in accordance with some embodiments. Accordingly, a MUF may also be filled into the space between neighboring metal traces 210. Alternatively, no MUF is filled, while air fills the space between work pieces 100 and 200, and fills the space between neighboring metal traces 210. FIG. 1B shows that the copper post (or metal bump) 112 has a width of $W_1$, in accordance with some embodiments. FIG. 1B also shows that the metal trace 210 has a width $W_2$, in accordance with some embodiments.

In some other embodiments, the ratio of $L_1/W_1$ is greater than 1. In some embodiments, the ratio of $L_1/W_1$ is equal to or greater than about 1.2. In some embodiments, the $L_1$ is in a range from about 10 μm to about 1000 μm. In some embodiments, W1 is in a range from about 10 μm to about 700 μm. In some embodiments, $W_2$ is in a range from about 10 μm to about 500 μm. The structure as shown in FIGS. 1A and 1B is referred to as being a BOT structure, because solder layer 220 is formed directly on the top surface and sidewalls of metal trace 210, and not on a metal pad that has a width significantly greater than width $W_2$ of metal trace 210. In some embodiments, the ratio of $W_1/W_2$ is in a range from about 0.25 to about 1.

Figure 2B:
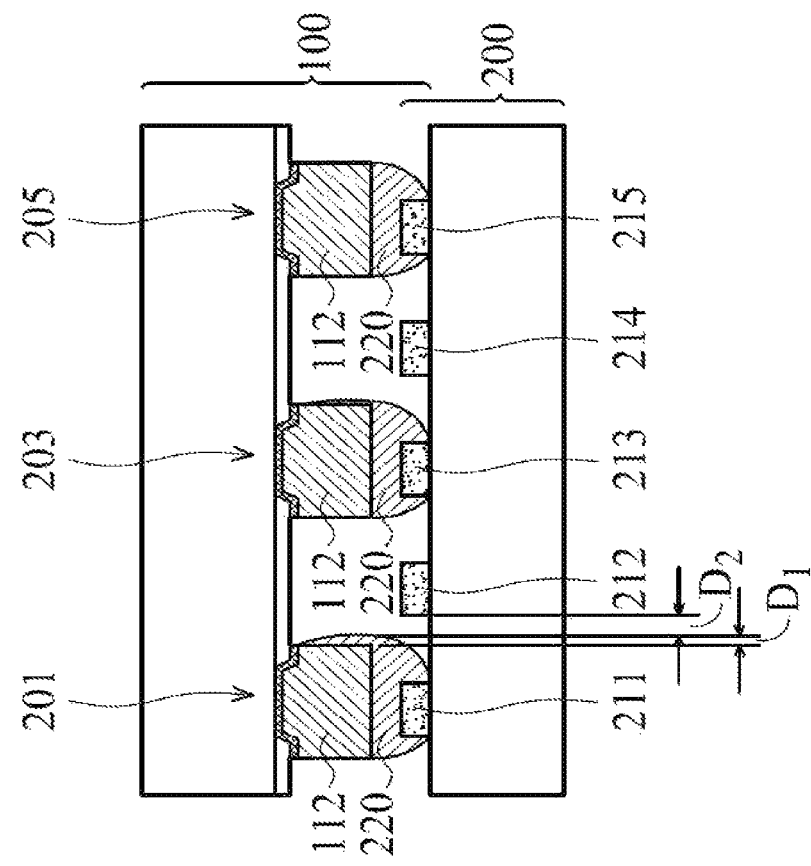
FIGS. 2A and 2B illustrate top and cross-sectional views of a bump-on-trace (BOT) region, in accordance with some embodiments.
Figure 2A:
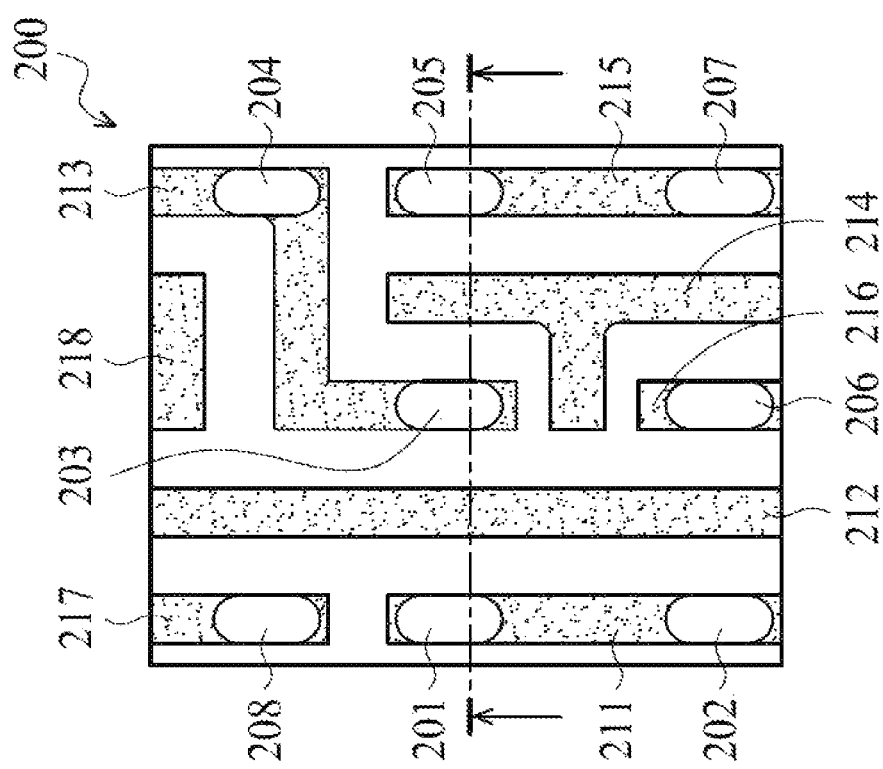

FIG. 2A shows a top view of a BOT region 200, in accordance with some embodiments. FIG. 2A shows a number of metal bumps 201-208 over metal traces 211-218. The metal traces provide the function of interconnection and connects metal bumps to one another. For example, metal trace 211 connects metal bump 201 and metal bump 202, in accordance with some embodiments. Metal bumps 201-208 include copper post 112, UBM layer 110 and solder layer 220 described above.

FIG. 2B shows a cross-sectional view of the BOT region 200 cut along A-A line, in accordance with some embodiments. FIG. 2B shows that metal bumps 201, 203, and 205 are placed on metal traces 211, 213, and 215. FIG. 2B also shows cross-sections of metal traces 212 and 214. Cross sections of metal bumps 201, 203, and 205 show a UBM layer 110, copper posts 112 with solder layer 220. The solder layer 220 wrap around the exposed surfaces of metal traces 211, 213 and 215 after reflow. FIG. 2B also shows that the solder layer 220 between copper post 112 of metal bump 201 protrudes beyond surface 231 of copper post 112 with a distance "$D_1$". As mentioned above, the reflowed solder of the solder layer 220 may also move along surfaces 113 of copper post 112 and cover portions or all of surfaces 113. Due to the pressure exerted by the work piece 100 on work piece 200, the surface 221 of solder layer 220 extends beyond the surface 113 of the copper post with a maximum distance of "$D_1$." Larger $D_1$ reduces the distance $D_2$ between the surface 113 and the neighboring metal trace surface 232 and increases the risk of shorting between metal traces 211 and 212. In addition, $D_2$ may be shortened by mis-alignment or by alignment error. With shrinking feature sizes and pitches, minimizing $D_1$ is important to improve yield. In some embodiments, $D_2$, the minimum distance between a bump and a neighboring metal trace, is specified to be equal to or greater than about 0.1 μm to avoid shorting. In some embodiments, the distance between the edge of copper post 112 to a closest edge of a metal trace 212, or $D_1+D_2$, is in a range is equal to or greater than about 1 μm. In some other embodiments, the distance is equal to or greater than about 5 μm.

Figure 3C:
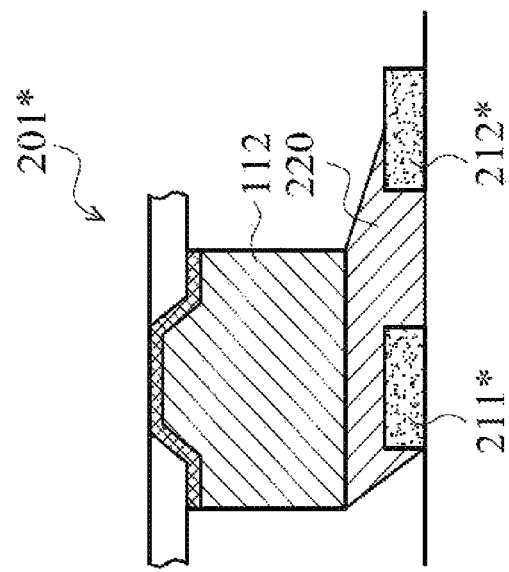
FIG. 3C illustrates protruding solder shorting with a neighboring metal trace, in accordance with some embodiments.
Figure 3B:
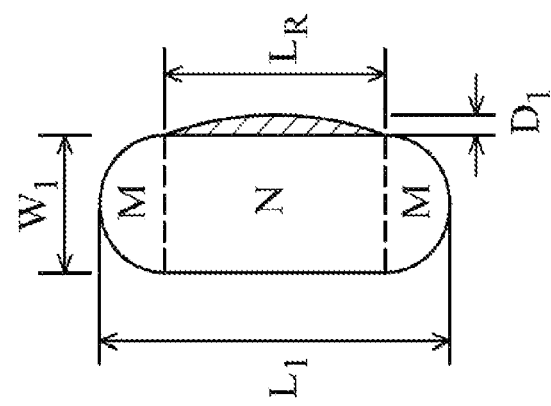
FIGS. 3A and 3B illustrate cross-sectional and top views of a metal bump, in accordance with some embodiments.
Figure 3A:
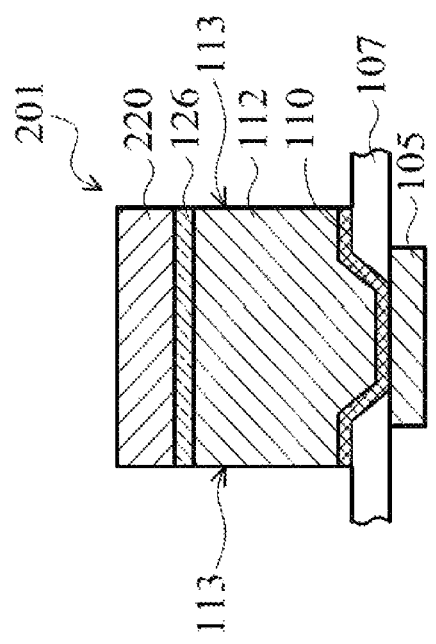

FIG. 3A shows a cross-sectional view of metal bump 201 before it is coupled to metal trace 211 and before solder reflow, in accordance with some embodiments. FIG. 3A shows that metal bump 201 includes a copper post 112 and a solder layer 220. There is an optional capping layer 126 between the copper post 112 and the solder layer 220. The cap layer 126 could act as a barrier layer to prevent copper in the Cu pillar 125 from diffusing into a bonding material, such as solder alloy, that is used to bond the substrate 101 to external features.

The solder layer 220 and copper post 112 may be formed by plating over the UBM layer 110, in accordance with some embodiments. Prior to the solder reflow, the solder layer 220 and copper post 112 share the same surfaces 113. FIG. 3B shows a top view of metal bump 201 of FIGS. 2A and 2B before bonding and reflow, in accordance with some embodiments. FIG. 3B shows the outline 310 of copper post 112. Outline 310 is also the outline for UBM layer 110. The copper post 112 shown in FIG. 3B is in the shape of a race track with two hemispheres (M sections) coupled to a rectangle (N section). The diameter of the two hemispheres $W_1$ is the same as the width of the rectangle, which is also shown in FIG. 1B. The total length of the metal bump 201 is $L_1$, as shown in FIG. 1A, and the length of the rectangle is $L_R$. Although the example in FIG. 3B is in the shape of a race track, other elongated shapes, such as oval shape, etc, are also applicable.

After reflow and under the pressure of being pressed against metal trace 211, solder layer 220 tends to protrude the most near the center region of the rectangle (N section). This could be due to less surface tension on the side walls of the center region (N section), in comparison to the edge sections (M sections).

As described above, the protrusion of the solder layer 220 (with a maximum protruding distance D1) increases the risk of shorting. FIG. 3C shows a cross-sectional view of a BOT structure, in accordance with some embodiments. FIG. 3C shows that the solder layer 220 of a metal bump 201* making contact with a neighboring metal trace 212* due to solder extrusion and some alignment error, which is expected due to process variation. As a result, it is desirable to reduce the protruding distance D1 to reduce of risk of shorting between metal bump 201, metal trace 211, and metal trace 212.

FIG. 4A shows a top view of a metal bump 400, in accordance with some embodiments. The metal bump is similar to metal bumps 201 described above. FIG. 4A shows an outline 401 of outer boundary of the UBM layer 100, which also significantly match the outer boundaries of copper post 112 and solder layer 220 before solder reflow. FIG. 4A shows that in order to reduce solder protrusion to reduce the shortest distance between the metal bump, such as metal bump 201, and a neighboring metal trace, such as metal trace 212, the width of the rectangular section (N section) of the metal bump is reduced from $W_1$ to $W_4$. Each side of the rectangular section is reduced by a width of $W_3$. FIG. 4B shows a side view of metal bump 400, in accordance with some embodiments. Metal bump 400 includes a solder layer 220, a copper post 112 and an UBM layer 110, in accordance with some embodiments. Alternatively, metal bump 400 could refer only to the copper post 112 or the copper post 112 with the UBM layer 110. The height of the solder layer 220 is $H_1$ and the height of the copper post is $H_2$. The height of the UBM layer is $H_3$. In some embodiments, $H_1$ is in a range from about 10 µm to about 50 µm. In some embodiments, $H_2$ is in a range from about 10 µm to about 70 µm. In some embodiments, $H_3$ is in a range from about 3 µm to about 15 µm.

As mentioned above, solder layer 220 tends to protrude in the middle section (or N section). By reducing the width of the middle section, the reflowed solder will fill the recess space created by the reduced width of the middle section (or rectangular section N). As a result, the risk of shorting due to protruding solder material can be reduced and yield can be improved. Such reduction to reduce shorting and to improve yield is important for advanced packaging. In some embodiments, the recess region is region R, which is shown in FIG. 4C. FIG. 4A shows that there are two recess regions R for metal bump 400. Recess region R includes recess region A of the solder layer 220, recess region B of copper post 112, and recess region C of the UBM layer 110, as shown in FIG. 3C in accordance with some embodiments. Equation (1) shows the volume of region R, in accordance with some embodiments.

$$R_{volume} = W_3 \times L_R \times (H_1 + H_2 + H_3) \tag{1}$$

Although reducing $W_1$ could reduce the risk of shorting, $W_1$ cannot be reduced too much to prevent insufficient coverage of solder on the metal trace underneath. In addition, small $W_1$ would lead to small UBM area, which could increase the stress at the interface 118 (as shown in FIGS. 1A and 1B) next to IMDs 108 and could result in interfacial delamination. Such interfacial delamination is a reliability concern and can affect yield. In some embodiments, the maximum width of the recess region $W_3$ is in a range from about 1 µm to about 30 µm. In some embodiments, the ratio of $W_3$ to $W_1$ is in a range from about 0.02 to about 0.5. In some embodiments, the volume ratio of recess regions R to the solder layer 220 of the metal bump 400 is greater than or equal to about 0.01, which means that the recess regions R for metal bump 400 is equal to or greater than about 1% of the volume of the solder layer 220. In some other embodiments, the volume ratio of recess regions R to the solder layer 220 of the metal bump 400 is equal to or less than about 0.1. In some embodiments, a ratio of the surface areas (or cross-sectional areas) of recess regions R, as viewed in FIG. 4A, to the surface area (or cross-sectional area) of bump 400 is equal to or greater than about 0.01. In some other embodiments, a ratio the surface areas (or cross-sectional areas) of recess regions R, as viewed in FIG. 4A, to the surface area (or cross-sectional area) of bump 400 is equal to or less than about 0.1.

Figure 4E:
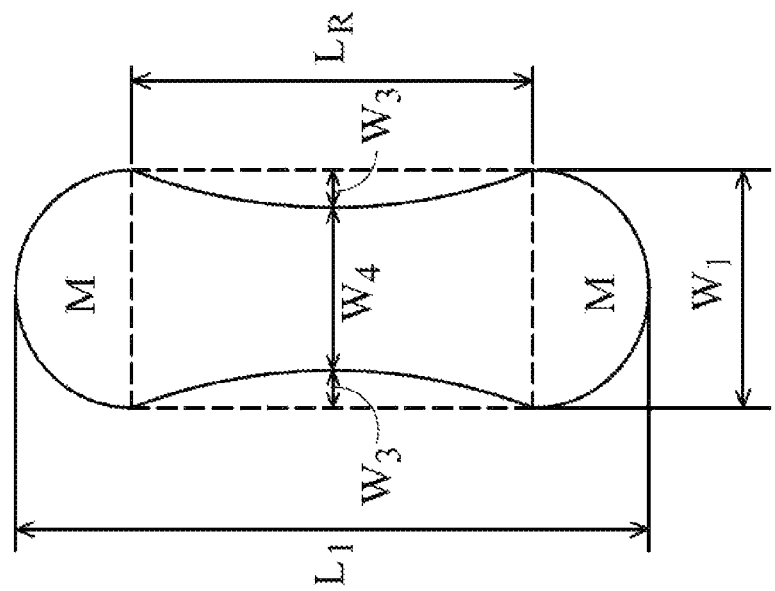
Figure 4D:
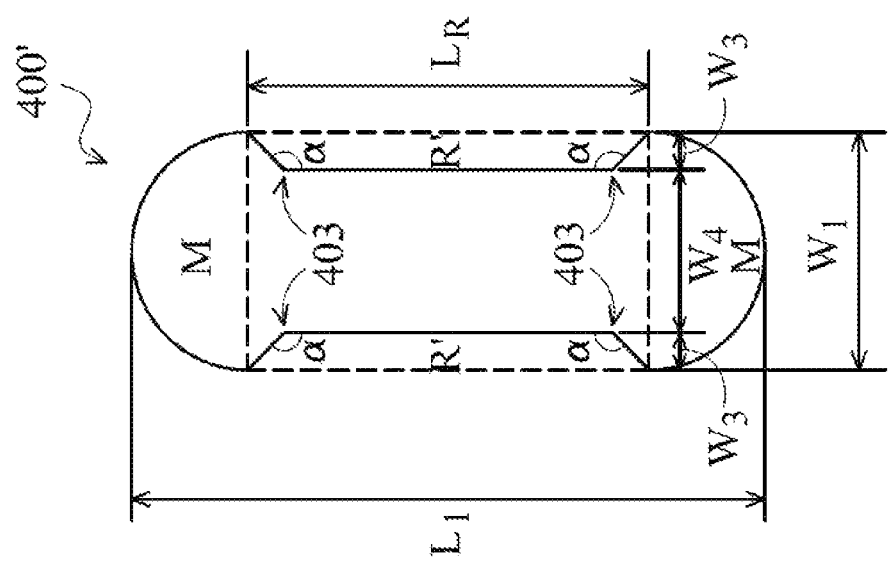

Other shapes of recess regions combined with various profiles of metal bumps may also be used to reduce solder metal protrusion. FIG. 4D shows a top view of a metal bump 400', in accordance with some embodiments. Metal bump 400' is similar to metal bump 400. The corners 402 of regions R of FIGS. 4A, 4B, and 4C are straight (or 90°). The corners 403 of the recess region R' of FIG. 4D is has an angle α. Angle α may be equal to or greater than 90°. A greater than 90° corner angle, α, may have less stress than a straight corner. However, angle a may be designed with an angle less than 90°, in accordance with some embodiments. In some embodiments, the M sections (or end sections) of metal bump 400 do not need to be in hemispherical shape. Other shapes are also possible. Further, the recess regions do not need to be formed by straight walls. FIG. 4E shows a metal bump 400* with the recess regions having curved side walls, in accordance with some embodiments. Other shapes and curvatures of sidewalls of recess regions are also possible.

The metal bumps described above without the recess regions have a cross section in the shape of a race track. Bumps with other shapes of cross sections may also be used. For example, the shape of a cross section may be an oval shape. The top views of metal bumps 400 may be in any elongated shapes, including a rectangle with rounded corners. Recess region(s) may be formed in such bumps to allow solder layers to fill (fully or partially) in the recess region(s) after reflow to reduce the risk of shorting.

The embodiments of bump and bump-on-trace (BOT) structures provide bumps with recess regions for reflowed solder to fill. The recess regions are placed in areas of the bumps where reflow solder is most likely to protrude. The recess regions reduce the risk of bump to trace shorting. As a result, yield can be improved.

Figure 5A:
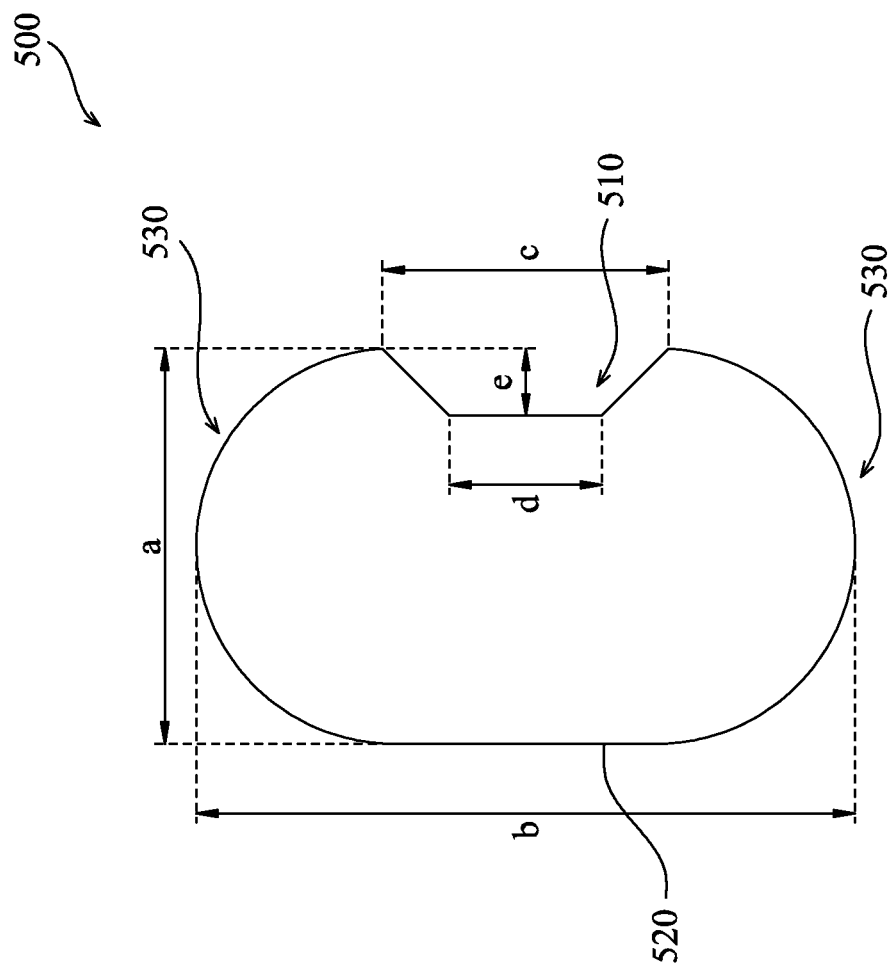
FIGS. 5A-5I are top views of a bump structure having a single side recess in accordance with some embodiments.

FIG. 5A is a top view of a bump structure 500 having a single side recess in accordance with some embodiments. Bump structure 500 is similar to bump structure 400 (FIG. 4A) except that bump structure 500 includes a recess on a single side of the bump structure. Bump structure 500 has a general race track shape. Bump structure 500 includes a recess 510 in one side. A side 520 of bump structure 500 opposite recess 510 is substantially straight. Ends 530 of bump structure 500 connect side 520 to the side having recess 510. Bump structure 500 has an overall width "a" and an overall length "b". Recess 510 has a first length "c" closest to an outer surface of bump structure 500. Recess 510 has a second length "d" closest to side 520. A depth "e" of recess 510 is a distance between the outer surface of bump structure 500 and a point of the recess closest to side 520.

Bump structure 500 is usable for connecting one die to another in a package. Bump structure 500 includes a conductive material. In some embodiments, the conductive material is copper, aluminum, tungsten, or another suitable conductive material. Bump structure 500 connects one die to another using a reflowed solder layer or a reflowed solder ball. During a reflow process, liquefied solder flows into recess 510. In comparison with bump structures which do not include recess 510, bump structure 500 is able to achieve a smaller pitch between adjacent bump structures with reduced risk of bridging between solder material of the adjacent bump structures. In some embodiments, bump structure 500 is part of a bump on trace (BOT) structure. In some embodiments, bump structure 500 is configured to connect to another bump structure. In some embodiments, the other bump structure includes at least one recessed side. In some embodiments, the other bump structure includes no recessed sides.

Figure 5D:
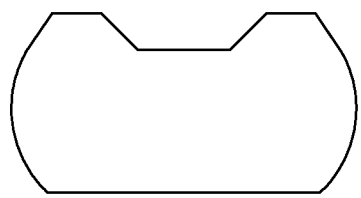
Figure 5C:
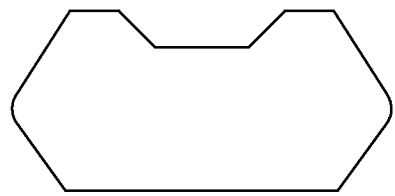
Figure 5F:
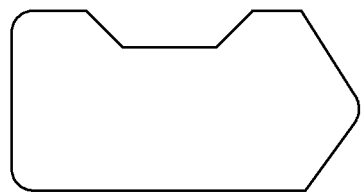
Figure 5B:
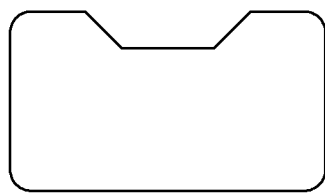
Figure 5E:
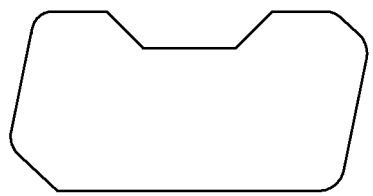

Ends 530 of bump structure 500 are continuous curves. In some embodiments, ends 530 are straight edges with rounded corners, such that a general shape of bump structure 500 is a rectangle having rounded corners as seen in FIG. 5B. In some embodiments, ends 530 have a different shape, such as a triangular (FIG. 5C), a polygon (FIG. 5D), a discontinuous curve (FIG. 5E) or another suitable shape. Ends 530 have a same shape. In some embodiments, one end 530 has a different shape from the other end 530 (FIG. 5F).

Bump structure 500 is usable for a 16 nanometer (nm) technology chip. In some embodiments, bump structure 500 is usable for a 28 nm technology chip. In some embodiments, bump structure 500 is usable for a 20 nm technology chip. In some embodiments, bump structure 500 is sized for a technology node other than 16 nm, 20 nm or 28 nm. In some embodiments, overall width "a" ranges from about 10 microns (µm) to about 200 µm. In some embodiments, overall width "a" ranges from about 25 µm to about 50 µm. If the overall width of bump structure 500 is too small, an electrical resistance of bump structure 500 increases and negatively impacts performance of a die connected to the bump structure; or a risk of the bump structure breaking during a packaging process increases. In addition, a risk of an open connection during a packaging operation due to misalignment increases if the overall width is too small. If the overall width of bump structure 500 is too great, a risk of bridging of solder materials of adjacent bump structures is increased. In some embodiments, overall length "b" ranges from about 20 µm to about 400 µm. In some embodiments, overall length "b" ranges from about 50 µm to about 80 µm. If the overall length of bump structure 500 is too small, the electrical resistance of the bump structure increases and adversely impacts performance of a device connected to the bump structure, in some instances. In addition, a mechanical strength of bump structure 500 is reduced and a risk of breaking during a packaging process increases if the overall length of the bump structure is too small. A risk of misalignment causing an open connection also increases if the overall length of bump structure 500 is too small. If the overall length of bump structure 500 is too large, a risk of bridging between solder materials of adjacent bump structures increases. In some embodiments, a ratio of overall width "a" to overall length "b" ranges from about 0.5 to about 1.0. If the ratio of overall width "a" to overall length "b" is too small, a mechanical strength of bump structure 500 is adversely impacted, in some instances. If the ratio of overall width "a" to overall length "b" is too great, a size of bump structure 500 is increased without a significant increase in performance and functionality, in some instances.

Figure 5I:
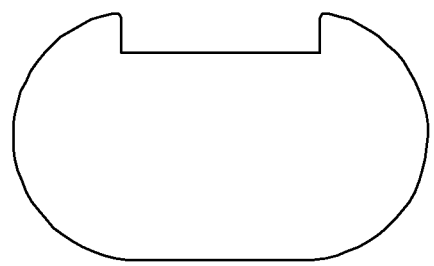
Figure 5H:
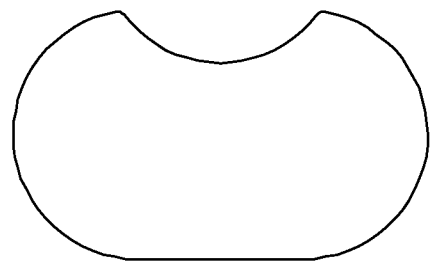
Figure 5G:
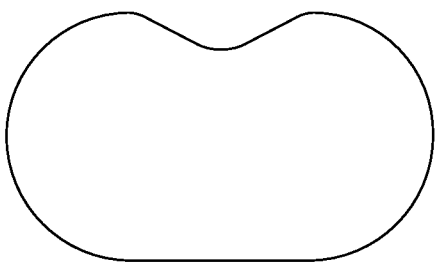

A surface of recess 510 closest to side 520 is parallel to side 520. In some embodiments, the surface of recess 510 closest to side 520 is angled with respect to side 520 (FIG. 5G). In some embodiments, the surface of recess 510 closest to side 520 is curved (FIG. 5H). In some embodiments, the curve is convex. In some embodiments, the curve is concave. In some embodiments, the second length "d" is less than or equal to about 30 µm. In some embodiments, the second length "d" is less than or equal to about 15 µm. In some embodiments, second length "d" is equal to 0 (FIGS. 5G and 5H). In some embodiments, a ratio of the second length "d" to the overall length "b" is less than or equal to about 0.3. In some embodiments, the ratio of the second length "d" to the overall length "b" is less than or equal to about 0.15. The second length is substantially zero when the surface closest to side 520 is curved or sidewalls of recess 510 intersect. If second length "d" or the ratio between the second length and the overall length "b" is too large, the electrical resistance of bump structure 500 increases and negatively impacts performance of a die connected to the bump structure; or a risk of the bump structure breaking during a packaging process increases, in some instances. In addition, a risk of an open connection during a packaging operation due to misalignment increases if second length "d" or the ratio between the second length and the overall length "b" is too large.

First length "c" of recess 510 provides an opening for solder material to flow into the recess during a reflow process. In some embodiments, first length "c" ranges from about 5 µm to about 50 µm. In some embodiments, first length "c" ranges from about 8 µm to about 15 µm. In some embodiments, first length "c" is substantially equal to second length "d" (FIG. 5I). In some embodiments, a ratio between first length "c" and overall length "b" ranges from about 0.3 to about 0.5. If first length "c" is too large or the ratio between first length "c" and overall length "b" is too great, the electrical resistance of bump structure 500 negatively impacts performance of a die connected to the bump structure, in some instances. Additionally, a risk of bump structure 500 breaking during a packaging process increases or an open connection during a packaging operation due to misalignment increases if first length "c" is too large or the ratio between first length "c" and overall length "b" is too great. If first length "c" is too small or the ratio between first length "c" and overall length "b" is too small, a size of recess 510 is not sufficient to reduce the risk of bridging between adjacent bump structures, in some instances.

Depth "e" of recess 510 provides a volume to receive solder material during a reflow process. In some embodiments, depth "e" ranges from about 0.5 µm to about 15 µm. In some embodiments, depth "e" ranges from about 1 µm to about 15 µm. In some embodiments, a ratio of depth "e" to overall width a ranges from about 0.05 to about 0.2. If depth "e" is too large or the ratio between depth "e" and overall width a is too great, the electrical resistance of bump structure 500 negatively impacts performance of a die connected to the bump structure, in some instances. Additionally, a risk of bump structure 500 breaking during a packaging process increases or an open connection during a packaging operation due to misalignment increases if depth "e" is too large or the ratio between depth "e" and overall width "a" is too great. If depth "e" is too small or the ratio between depth "e" and overall width "a" is too small, the size of recess 510 is not sufficient to reduce the risk of bridging between adjacent bump structures, in some instances.

As a pitch between bump structures decreases, an overall size of the bump structures is reduced. For example, a 28 nm technology node chip includes a bump pitch of about 100 µm to about 160 µm, in some instances. For a chip which is about 10 mm×10 mm, the number of bump structures is approximately 1000 bump structures to connect the chip to another structure. In contrast, a 16 nm technology node chip includes a bump pitch of about 80 µm to about 120 µm, in some embodiments. The 16 nm technology node chip will have 3-4 times the number of bump structures for a 10 mm×10 mm chip in comparison with the 28 nm technology node chip. In some embodiments, a 10 nm technology chip includes a bump pitch of about 40 µm to about 100 µm. The 10 nm technology chip will have even more bump structures for a 10 mm×10 mm chip than a 16 nm technology node chip. Due to the increased number of bump structures on a chip as technology nodes decrease, recessing both sides of the bump structures has a greater overall impact in an ability of a chip including the recessed bump structures to maintain functionality when packaged with another structure due to increased resistance. In addition, mechanical strength of a connection point between a bump structure having a single recess side (FIG. 5A) and a die is greater than a connection point between a bump structure having recesses on both sides (FIG. 4A) and a die. By recessing a single side of bump structures 500, the increased resistance and reduced mechanical strength of the bump structure resulting from the recess is reduced in comparison with a bump structure which is recessed on both sides of the bump structure.

Figure 6:
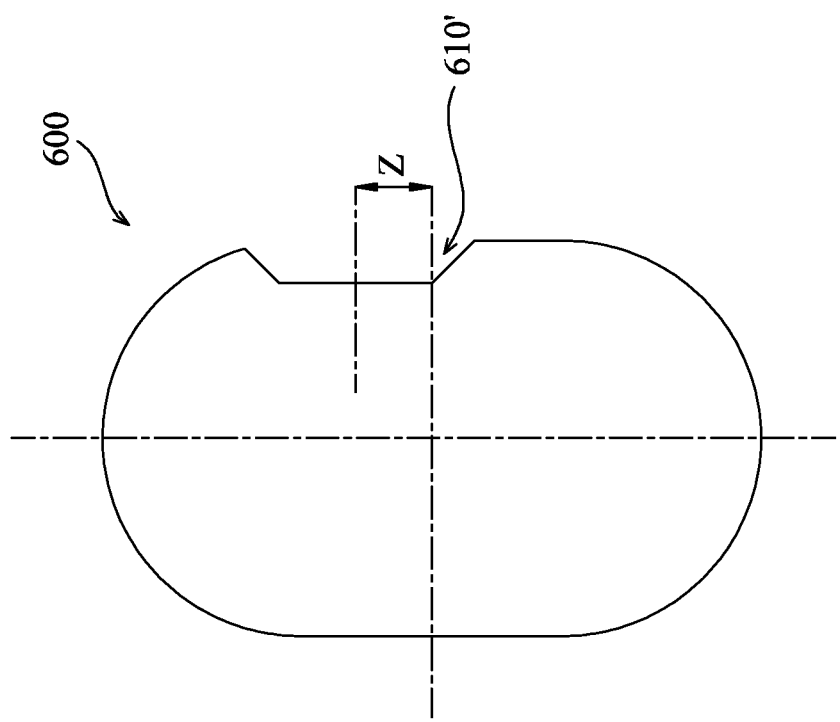
FIG. 6 is a top view of a bump structure having a single side recess in accordance with some embodiments.

FIG. 6 is a top view of a bump structure 600 having a single side recess in accordance with some embodiments. Bump structure 600 includes a recess 610 offset from a center of a length of the bump structure. In some embodiments, an offset distance z from a center of recess 610 to the center of the length of bump structure 600 is less than or equal to about 7 µm. In some embodiments, a ratio of offset z to an overall length of bump structure 600 is less than or equal to about 0.15. If offset z is too large or the ratio between offset z and the overall length of bump structure 600 is too great, a risk of an open connection during a packaging operation due to misalignment increases, in some instances.

Figure 7:
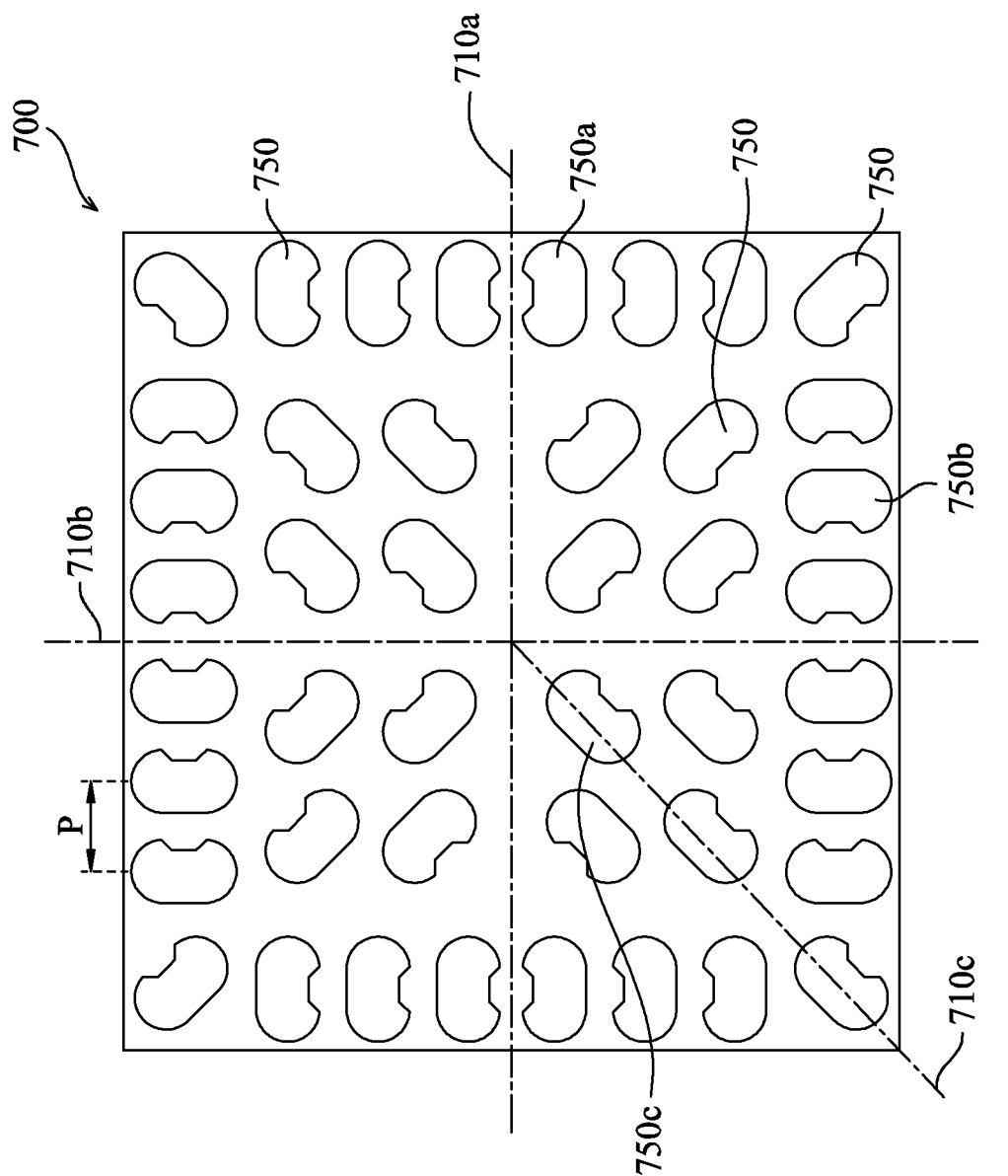
FIG. 7 is a top view of an array of bump structures having a single side recess on a die in accordance with some embodiments.

FIG. 7 is a top view of an array 700 of bump structures 750 having a single side recess on a die in accordance with some embodiments. Array 700 includes a pitch P between adjacent bump structure 750. Center lines 710*a* and 710*b* divide array 700 into four substantially equal quadrants. Each bump structure 750 of array 700 includes a single recess, similar to bump structure 500 (FIG. 5). A line 710*c* extends from a center of array 700 to a corner of the array. In some embodiments, bump structures 750 which are in a core region or a corner region of array 700 are angled so that a longitudinal axis of the bump structure is substantially parallel to line 710*c*.

A side of bump structures 750 including a recess is oriented toward a closest center line of center line 710*a* and center line 710*b*. That is, a bump structure, such as bump structure 750*a*, which is located closer to center line 710*a* than center line 710*b* includes a recess in the side of the bump structure facing center line 710*a*. Conversely, a bump structure, such as bump structure 750*b*, located closer to center line 710*b* than center line 710*a* includes a recess in the side of the bump structure facing center line 710*b*. In some embodiments, a bump structure, such as bump structure 750*c*, which is equidistant from center line 710*a* and center line 710*b* includes a recess in the side of the bump structure facing center line 710*b*. In some embodiments, a bump structure 750 which is equidistant from center line 710*a* and center line 710*b* includes a recess in the side of the bump structure facing center line 710*a*. In some embodiments, a first bump structure 750 which is equidistant from center line 710*a* and center line 710*b* has a recess in the side of the first bump structure facing center line 710*a* and a second bump structure 750 which is equidistant from center line 710*a* and center line 710*b* has a recess in the side of the second bump structure facing center line 710*b*. In some embodiments, pitch P between adjacent bump structures 750 ranges from about 40 µm to about 200 µm.

Bump structures 750 are bonded to another die using a solder reflow process. In some embodiments, bump structures 750 are part of an active die, a passive die, an interposer, or another suitable connection structure. The recess of bump structures 750 is oriented toward the closest center line 710*a* or 710*b* in order to capture reflowed solder material during a packaging process. During the solder reflow process, a die being bonded to bump structures 750 is heated. In some embodiments, the die is an active die, a passive die, an interposer or another suitable connection structure. When the die cools the die shrinks. A magnitude of the shrinkage of the die is based on a coefficient of thermal expansion of a material of the die and an overall size of the die. This shrinking causes edges of the bonded die to move inwardly in a plane parallel to array 700 toward center line 710*a* and center line 710*b*. The movement of the edges of the die pulls solder material, which is still cooling from the reflow process toward, center line 710*a* and center line 710*b*. For example, referring to FIG. 3C, a center line of a die having trace 211\* and trace 212\* is located to a right side of trace 212\*. As the die shrinks toward a center of the die following a reflow process solder 220 is pulled toward the center of the die. In structures which do not include the recess of bump structures 750, the pulling of the solder material during shrinkage of the die is most likely to cause bridging in a direction toward the center line 710*a* and center line 710*b*. By including the recesses of bump structures 750 oriented toward a closest center line of center line 710*a* or center line 710*b*, the risk of bridging in the direction of shrinkage is reduced in comparison with structures that do not include the recess. In some embodiments, a depth, e.g., depth "e" (FIG. 5A), of the recess of bump structures 750 is determined based on the coefficient of thermal expansion of the die bonded to bump structures 750 or a size of the die boned to bump structures 750. In some embodiments, as the coefficient of thermal expansion of the die bonded to bump structures 750 increases the depth of the recesses of bump structures 750 increases. In some embodiments, as the size of the die bonded to bump structures 750 increases, the depth of the recesses of bump structures 750 increases.

Figure 8:
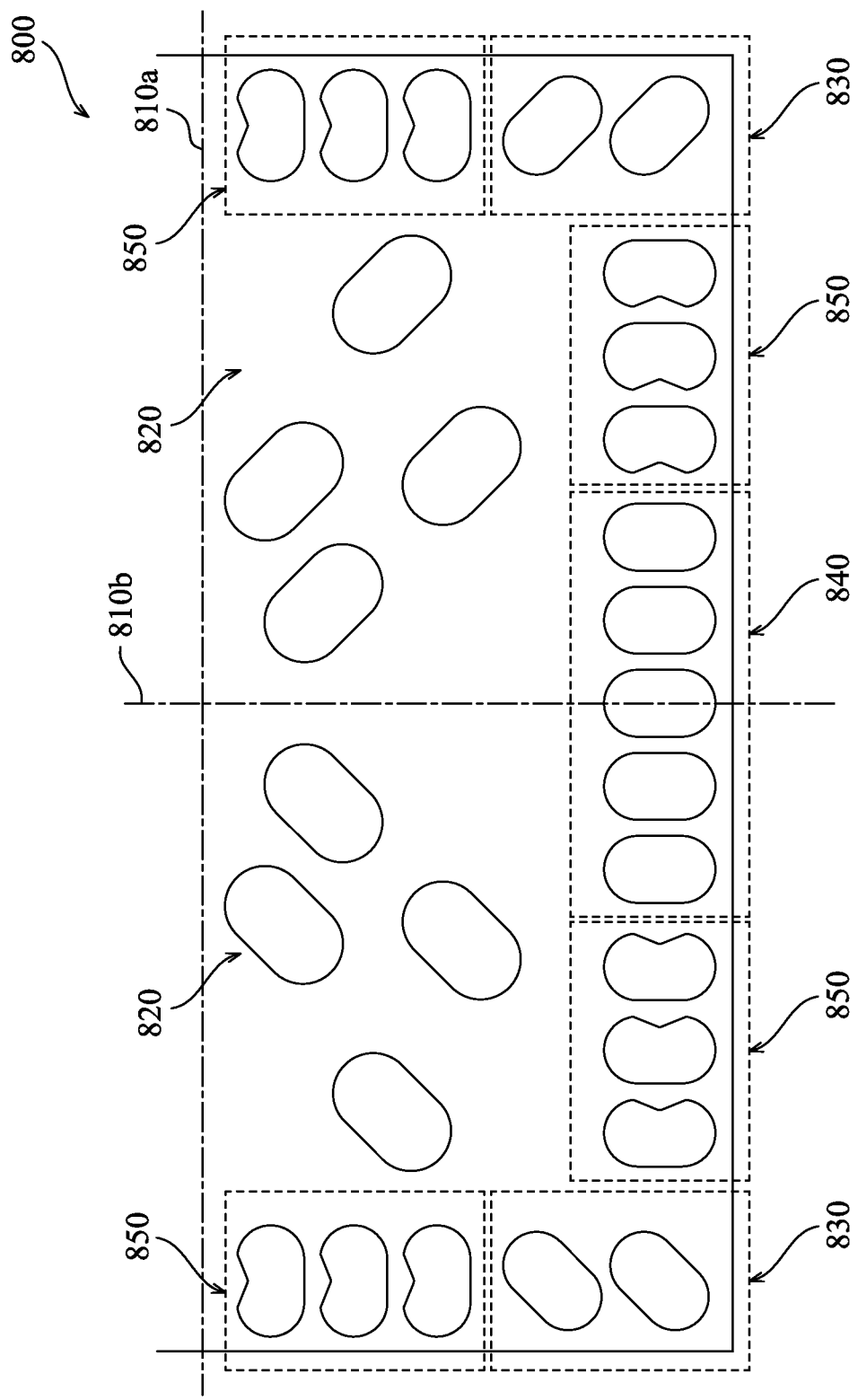
FIG. 8 is a top view of a portion of an array of bump structures having a single side recess on a die in accordance with some embodiments.

FIG. 8 is a top view of a portion of an array 800 of bump structures having a single side recess on a die in accordance with some embodiments. FIG. 8 includes half of array 800, i.e., the half of array 800 below a center line 810*a*. In comparison with array 700 (FIG. 7), array 800 includes at least one bump structure which does not include a recess. Array 800 includes a core region 820 having bump structures. Bump structures in core region 820 include non-recessed sides. In some embodiments, at least one bump structure in core region 820 includes a recess. The bump structures of core region 820 have a longitudinal axis at an angle with respect to center line 810*a* and center line 810*b*. Array 800 also includes a corner region 830 having bump structures. Bump structures in corner region 830 include non-recessed sides, similar to bump structures in core region 820. In some embodiments, at least one bump structure in corner region 830 includes a recess. The bump structures in corner region 830 have a longitudinal axis oriented at an angle to center line 810*a* and center line 810*b*. A central peripheral region 840 of array 800 also includes bump structures. Bump structures of central peripheral region 840 include non-recessed sides. In some embodiments, at least one bump structure in central peripheral region 840 includes a recess. The bump structures in central peripheral region 840 have a longitudinal axis substantially parallel to a closest center line of center line 810*a* or center line 810*b*. In some embodiments, an arrangement of bump structures in corner region 830 and core region 820 has a layout based on the bump arrangement described in U.S. Pat. No. 8,598,691, which is incorporated herein by reference in its entirety. Array 800 also includes a recess peripheral region 850 including bump structures. Each bump structure in recess peripheral region 850 includes a recess oriented toward a closest center line of center line 810*a* or center line 810*b*. Recess peripheral region 850 is located at an edge of array 800 between central peripheral region 840 and corner region 830. The bump structures of recess peripheral region 850 have a longitudinal axis substantially parallel to the closest center line of center line 810*a* or center line 810*b*.

As discussed above, recessed bump structures have increased electrical resistance in comparison with a bump structure having non-recessed sides. The recessed bump structure also has a lower mechanical strength than non-recess bump structures. By concentrating recessed bump structures in regions of array 800 where a bridging risk is highest, the above drawbacks of recessing the sides of the bump structures are mitigated in other portions of array 800. Recess peripheral region 850 is a location of highest bridging risk of array 800 because the edge of the die bonded to the bump structures of array 800 experiences a largest magnitude of shrinkage following a reflow process.

Array 800 includes recess peripheral region 850 having a single row of bump structures. In some embodiments, recess peripheral region 850 includes multiple rows of bump structures. In some embodiments, array 800 includes a single recess peripheral region 850. In some embodiments, the single recess peripheral region 850 includes a single recessed bump structure. In some embodiments, the single recessed bump structure is adjacent to a corner region 830 of array 800.

In some embodiments, as the coefficient of thermal expansion of the die bonded to array 800 increases, a size of recess peripheral region 850 increases. In some embodiments, as the size of the die bonded to array 800 increases, the size of recess peripheral region 850 increases. In some embodiments, the size of recess peripheral region 850 is determined based on empirical evidence from previous package structures.

Figure 9:
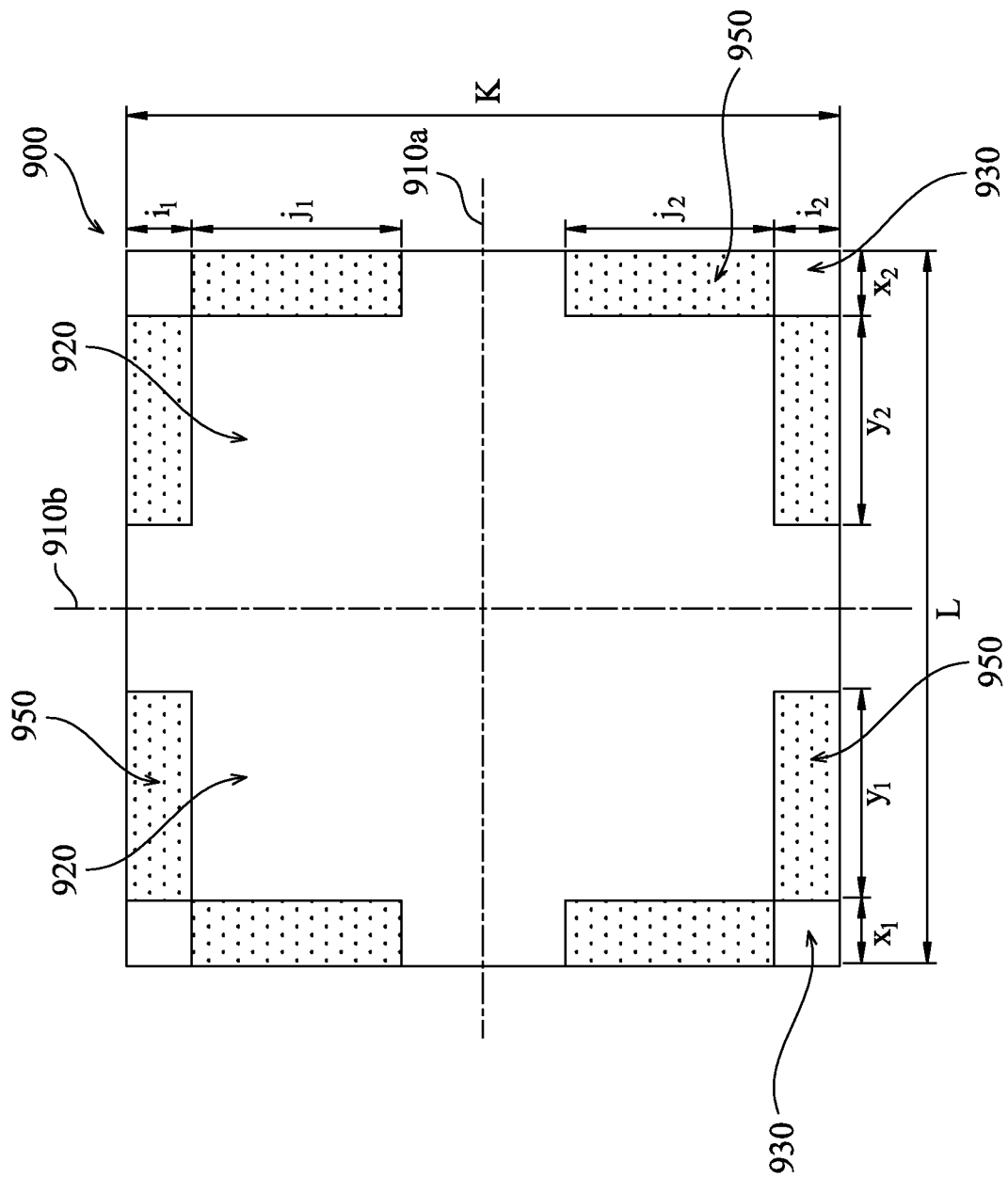
FIG. 9 is a top view of a die having bump structures having a single side recess in accordance with some embodiments.

FIG. 9 is a top view of a die 900 having bump structures having a single side recess in accordance with some embodiments. Die 900 includes core region 920 similar to core region 820 (FIG. 8). Die 900 further includes corner region 930 similar to corner region 830. Die 900 further includes recess peripheral region 950 similar to recess peripheral region 850. In some embodiments, die 900 also includes a central peripheral region similar to central peripheral region 840.

A first corner region extending parallel to center line 910*a* has a length x1 parallel to center line 910*a*. In some embodiment, a ratio of length x1 to an overall length L of die 900 parallel to center line 910*a* ranges from about 0.02 to about 0.1. If the ratio of length x1 to the overall length of die 900 is too great, a risk of bridging of bump structures within the first corner region increases, in some instances. If the ratio of length x1 to the overall length of die 900 is too small, a mechanical structure of the bump structures in the first corner region is needlessly reduced or the electrical resistance of the bump structures in the first corner region is needlessly increased, in some instances.

A first recess peripheral region extending parallel to center line 910*a* has a length $y_1$ parallel to center line 910*a*. In some embodiment, a ratio of length $y_1$ to an overall length L of die 900 parallel to center line 910*a* ranges from about 0.2 to about 0.3. If the ratio of length $y_1$ to the overall length of die 900 is too great, a mechanical structure of the bump structures in the first recess peripheral region is needlessly reduced or the electrical resistance of the bump structures in the first recess peripheral region is needlessly increased, in some instances. If the ratio of length $y_1$ to the overall length of die 900 is too small, a risk of bridging of bump structures within the first corner region increases, in some instances.

A second corner region extending parallel to center line 910*a* has a length $x_2$ parallel to center line 910*a*. In some embodiment, a ratio of length $x_2$ to an overall length of die 900 parallel to center line 910*a* ranges from about 0.02 to about 0.1. If the ratio of length x2 to the overall length L of die 900 is too great, a risk of bridging of bump structures within the first corner region increases, in some instances. If the ratio of length $x_2$ to the overall length of die 900 is too small, a mechanical structure of the bump structures in the first corner region is needlessly reduced or the electrical resistance of the bump structures in the first corner region is needlessly increased, in some instances. In some embodiments, length $x_2$ is equal to length $x_1$. In some embodiments, length $x_2$ is different from length $x_1$. In some embodiments, a magnitude of length $x_1$ or length $x_2$ is determined based on empirical information, a coefficient of thermal expansion of a die bonded to die 900, or a size of the die bonded to die 900.

A second recess peripheral region extending parallel to center line 910*a* has a length $y_2$ parallel to center line 910*a*. In some embodiment, a ratio of length $y_2$ to an overall length L of die 900 parallel to center line 910*a* ranges from about 0.2 to about 0.3. If the ratio of length $y_2$ to the overall length of die 900 is too great, a mechanical structure of the bump structures in the first recess peripheral region is needlessly reduced or the electrical resistance of the bump structures in the first recess peripheral region is needlessly increased, in some instances. If the ratio of length $y_2$ to the overall length of die 900 is too small, a risk of bridging of bump structures within the first corner region increases, in some instances. In some embodiments, length $y_2$ is equal to length $y_1$. In some embodiments, length $y_2$ is different from length $y_1$. In some embodiments, a magnitude of length $y_1$ or length $y_2$ is determined based on empirical information, a coefficient of thermal expansion of a die bonded to die 900, or a size of the die bonded to die 900.

A third corner region extending parallel to center line 910*b* has a length $i_1$ parallel to center line 910*b*. In some embodiment, a ratio of length $i_1$ to an overall length K of die 900 parallel to center line 910*b* ranges from about 0.02 to about 0.1. If the ratio of length ii to the overall length of die 900 is too great, a risk of bridging of bump structures within the first corner region increases, in some instances. If the ratio of length $i_1$ to the overall length of die 900 is too small, a mechanical structure of the bump structures in the first corner region is needlessly reduced or the electrical resistance of the bump structures in the first corner region is needlessly increased, in some instances.

A third recess peripheral region extending parallel to center line 910*b* has a length $j_1$ parallel to center line 910*b*. In some embodiment, a ratio of length $j_1$ to an overall length K of die 900 parallel to center line 910*b* ranges from about 0.2 to about 0.3. If the ratio of length $j_1$ to the overall length of die 900 is too great, a mechanical structure of the bump structures in the first recess peripheral region is needlessly reduced or the electrical resistance of the bump structures in the first recess peripheral region is needlessly increased, in some instances. If the ratio of length $j_1$ to the overall length of die 900 is too small, a risk of bridging of bump structures within the first corner region increases, in some instances.

A fourth corner region extending parallel to center line 910b has a length $i_2$ parallel to center line 910b. In some embodiment, a ratio of length $i_2$ to an overall length K of die 900 parallel to center line 910b ranges from about 0.02 to about 0.1. If the ratio of length $i_2$ to the overall length of die 900 is too great, a risk of bridging of bump structures within the first corner region increases, in some instances. If the ratio of length $i_2$ to the overall length of die 900 is too small, a mechanical structure of the bump structures in the first corner region is needlessly reduced or the electrical resistance of the bump structures in the first corner region is needlessly increased, in some instances. In some embodiments, length $i_2$ is equal to at least one of length $x_1$, length $x_2$ or length $i_1$. In some embodiments, length $x_2$ is different from at least one of length $x_1$, length $x_2$ or length $i_1$. In some embodiments, a magnitude of length $i_1$ or length $i_2$ is determined based on empirical information, a coefficient of thermal expansion of a die bonded to die 900, or a size of the die bonded to die 900.

A fourth recess peripheral region extending parallel to center line 910b has a length $j_2$ parallel to center line 910b. In some embodiment, a ratio of length $j_2$ to an overall length K of die 900 parallel to center line 910b ranges from about 0.2 to about 0.3. If the ratio of length $j_2$ to the overall length of die 900 is too great, a mechanical structure of the bump structures in the first recess peripheral region is needlessly reduced or the electrical resistance of the bump structures in the first recess peripheral region is needlessly increased, in some instances. If the ratio of length $j_2$ to the overall length of die 900 is too small, a risk of bridging of bump structures within the first corner region increases, in some instances. In some embodiments, length $j_2$ is equal to at least one of length $y_1$, length $y_2$ or length $j_1$. In some embodiments, length $j_2$ is different from at least one of length $y_1$, length $y_2$ or length $j_1$. In some embodiments, a magnitude of length $j_1$ or length $j_2$ is determined based on empirical information, a coefficient of thermal expansion of a die bonded to die 900, or a size of the die bonded to die 900.

Figure 10A:
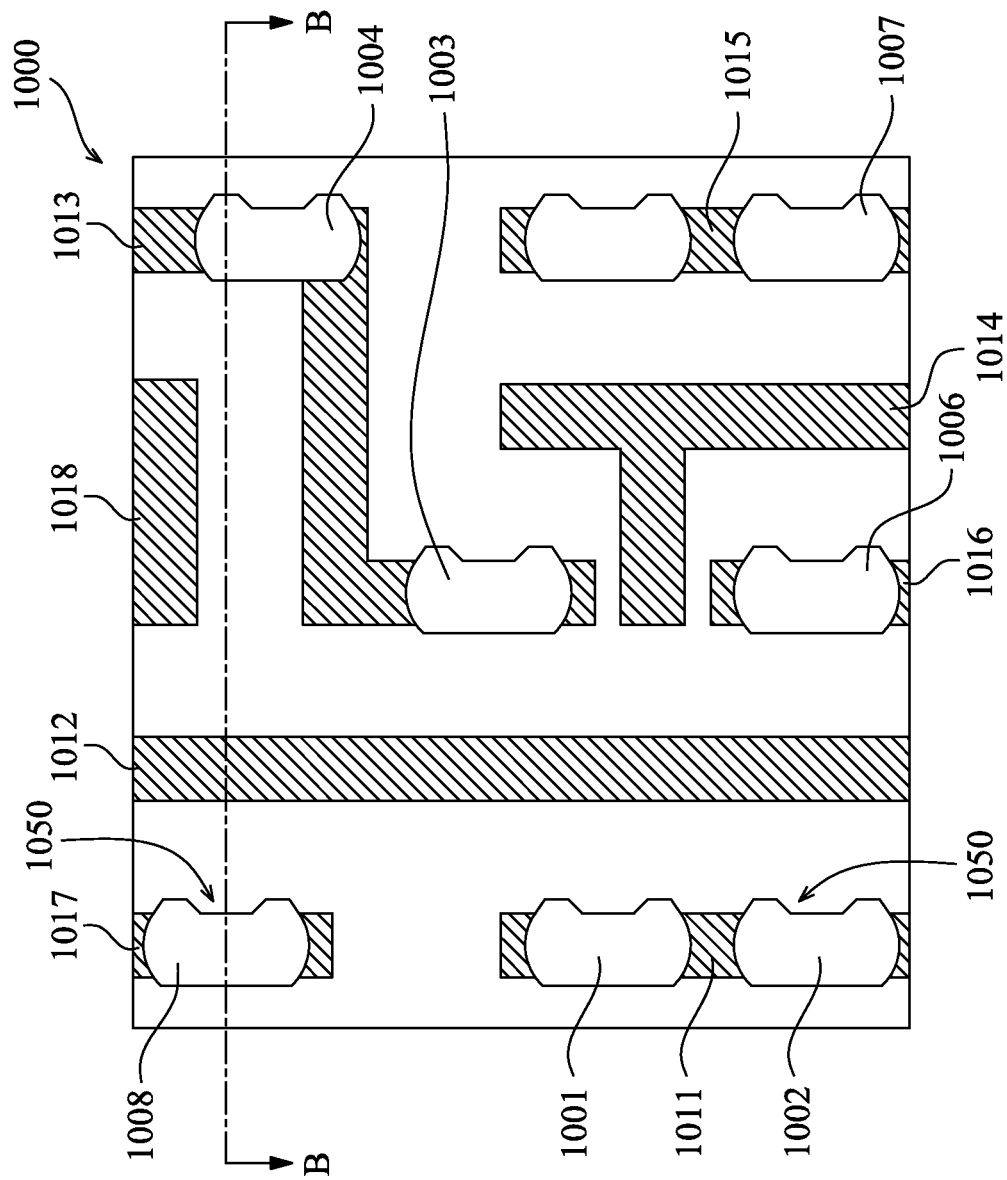
FIG. 10A is a top view of a of a BOT region in accordance with some embodiments.

FIG. 10A is a top view of a BOT region 1000 in accordance with some embodiments. BOT region 1000 is similar to work piece 200 and similar elements have a same reference number increased by 200. In comparison with work piece 200 BOT region 1000 includes bump structures 1001-1008 including a recess 1050. Each recess 1050 is facing toward a center of a die including BOT region 1000, i.e., to a right side of FIG. 10A. Recess 1050 is configured to receive solder which is reflowed during a bonding of bmp structures 1001-1008 to corresponding traces 1011-1018. Bump structures 1001-1008 are wider than traces 1011-1018. FIG. 10A includes each trace 1011-1018 fully landed on by a corresponding bump structure 1001-1008. In some embodiments, at least one trace 1011-1018 is only partially landed on by a corresponding bump structure 1001-1008. Traces 1011-1018 are conductive lines. In some embodiments, traces 1011-1018 include copper, aluminum, tungsten, or another suitable conductive material.

Figure 10B:
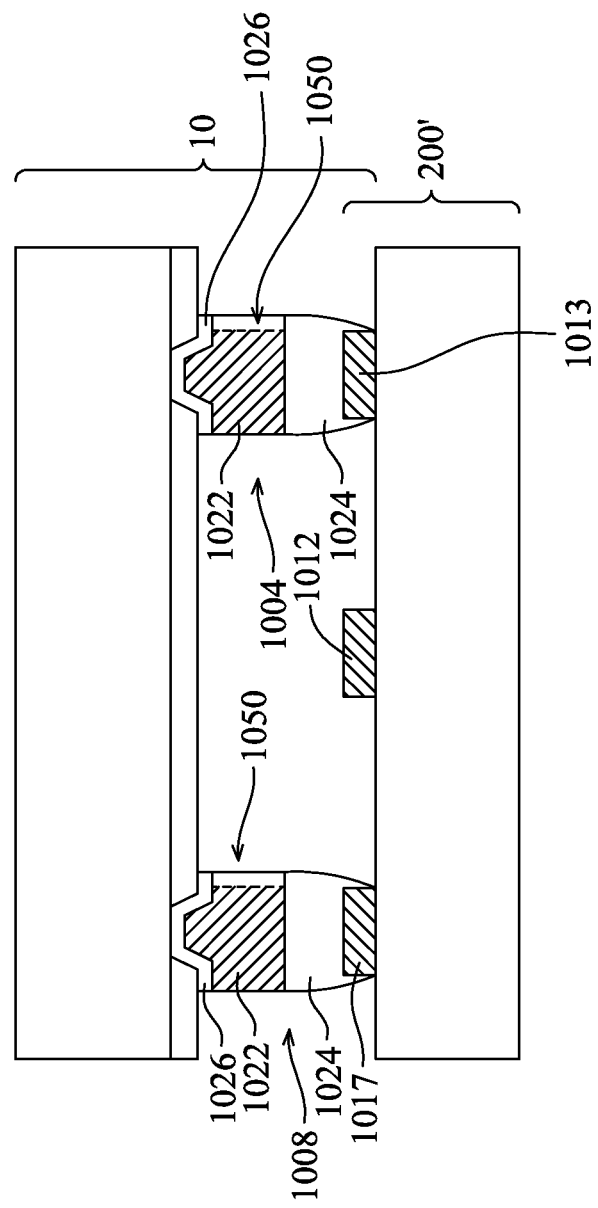
FIG. 10B is a cross-sectional view of a BOT region in accordance with some embodiments.

FIG. 10B is a cross-sectional view of BOT region 1000 taken along line B-B in accordance with some embodiments. BOT region 1000 includes a first work piece 100' bonded to a second work piece 200'. Second work piece 100' includes traces 1011-1018. Traces 1011-1018 are electrically connected to active elements or passive elements within second work piece 200'. First work piece 100' includes bump structures 1001-1008. Bump structures 1001-1008 are electrically connected to active elements or passive elements within the first work piece 100'.

Bump structure 1001-1008 includes a conductive post 1022, a solder material 1024 and a UBM layer 1026. During a bonding process, solder material 1024 is reflowed in order to bond with a corresponding trace 1011-1018. When solder material 1024 is reflowed a portion of the reflowed solder material flows into recess 1050. The portion of solder material 1024 which flows into recess 1050 reduces a total width of the bonded bump structure 1001-1008 in comparison with a bump structure which does not include recess 1050. The reduced width of bump structure 1001-1008 reduces facilitates a reduced pitch between bump structures by reducing a risk of bridging between adjacent bump structures in an array having the reduced pitch. Reducing a pitch between bump structures 1001-1008 facilitates an increased density of connections between first work piece 100' and second work piece 200'.

Figure 11A:
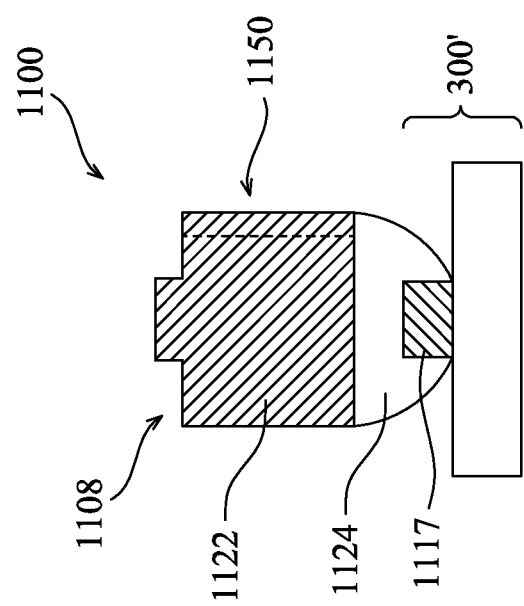
FIG. 11A is a cross-sectional view of a BOT region in accordance with some embodiments.

FIG. 11A is a cross-sectional view of a BOT region 1100 in accordance with some embodiments. BOT region 1110 is similar to BOT region 1000 (FIG. 10B). Same elements have a same reference number increased by 100. In comparison with BOT region 1000, BOT region 1100 does not include firs work piece 100'. Conductive post 1122 is able to be bonded to an additional work piece. In some embodiments, the additional work piece includes a work piece including active circuitry, a work piece including passive circuitry, an interposer or another suitable work piece. Recess 1150 is indicated as a dotted line because the recess is located in a plane other than the cross-sectional view of BOT region 1100.

Figure 11B:
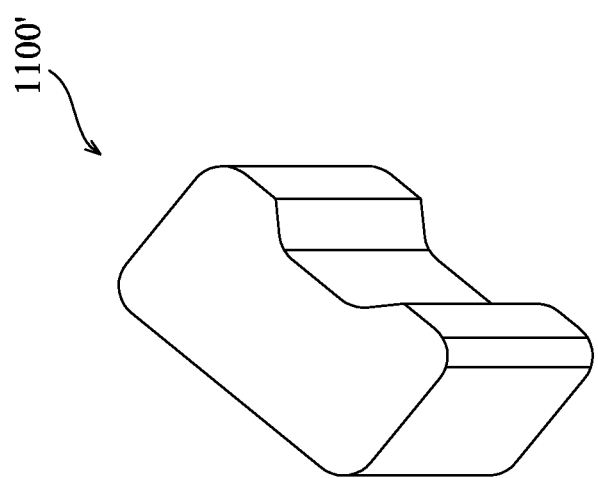
FIG. 11B is a perspective view of a bump structure having a single side recess in accordance with some embodiments.

FIG. 11B is a perspective view of a bump structure 1100' in accordance with some embodiments. An overall shape of bump structure 1100' is rectangular and includes flat end faces and rounded corners. Bump structure 1100' also includes a trapezoidal recess. In some embodiments, the overall shape of bump structure 1100' is different from a rectangular shape, as indicated in FIGS. 5A-5I. In some embodiments, the recess of bump structure 1100' is different form a trapezoidal shape, as indicated in FIGS. 5A-5I.

One aspect of this description relates to a semiconductor structure. The semiconductor structure comprises a first conductive structure and a second conductive structure arranged over a first substrate. A bump structure is arranged between the first conductive structure and a second substrate. A solder layer is configured to electrically couple the first conductive structure and the bump structure. The bump structure comprises a recess configured to reduce a protrusion of the solder layer in a direction extending from the first conductive structure to the second conductive structure.

Another aspect of this description relates to a semiconductor structure. The semiconductor structure comprises a conductive trace arranged on a first work piece. A conductive bump is arranged between the conductive trace and a second work piece. The conductive bump has a recess region. A solder bump is arranged between the conductive trace and the conductive bump. The solder bump fills the recess region at least partially.

Still another aspect of this description relates to a semiconductor structure. The semiconductor structure comprises a metal trace arranged on a first work piece. The metal trace extends in a first direction. A conductive bump is arranged on a second work piece. The conductive bump has a recess facing in a second direction that is different than the first direction. A solder layer is between the metal trace and the conductive bump. The solder layer fills a part of the recess.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated chip structure, comprising:
 a first substrate comprising a semiconductor material;
 an interposer substrate comprising conductive routing layers;
 a copper bump disposed between the first substrate and the interposer substrate, wherein the copper bump has a sidewall forming a recess, the sidewall extending from an upper horizontally extending surface of the copper bump to a lower horizontally extending surface of the copper bump;
 a solder disposed over the copper bump and continuously extending from over the copper bump to within the recess, wherein the solder completely covers the sidewall of the copper bump forming the recess and wherein the copper bump vertically extends below a bottom of the solder; and
 a conductive layer disposed between the first substrate and the interposer substrate and separated from the copper bump by the solder.

2. The integrated chip structure of claim 1,
 wherein the copper bump comprises one or more additional sidewalls extending outward from the lower horizontally extending surface of the copper bump facing the first substrate; and
 wherein the recess is over the lower horizontally extending surface.

3. The integrated chip structure of claim 1, wherein the solder laterally extends from directly over the copper bump to laterally beyond the sidewall defining the recess.

4. The integrated chip structure of claim 1, wherein the solder comprises a lead-free solder.

5. The integrated chip structure of claim 1, wherein the conductive routing layers are disposed within a dielectric structure.

6. The integrated chip structure of claim 1, wherein the conductive layer has a smaller width than the solder along a cross-sectional view.

7. An integrated chip structure, comprising:
 a first substrate;
 an interposer substrate comprising one or more conductive routing structures;
 a copper structure disposed between the first substrate and the interposer substrate, wherein the copper structure has an outermost sidewall forming a recess, as viewed in a cross-sectional view;
 a solder disposed along multiple surfaces of the copper structure and within the recess, the solder covering the outermost sidewall of the copper structure in the cross-sectional view;
 a nickel layer disposed vertically between the copper structure and the solder, the nickel layer laterally extending past an additional sidewall of the copper structure, as viewed in the cross-sectional view, wherein the solder covers an outermost sidewall of the nickel layer; and
 a conductive structure disposed between the first substrate and the interposer substrate, the solder being directly between the copper structure and the conductive structure.

8. The integrated chip structure of claim 7, wherein the copper structure has a first width and the solder has a second width, the second width being larger than the first width.

9. The integrated chip structure of claim 7, wherein the copper structure has a first height and the solder has a second height, the second height being larger than the first height.

10. The integrated chip structure of claim 7, wherein the solder has a curved outer surface vertically overlapping the copper structure.

11. The integrated chip structure of claim 7, wherein the copper structure has a protrusion that extends outward from a surface of the copper structure facing away from the solder, the protrusion being substantially centered along the surface.

12. The integrated chip structure of claim 7, wherein the nickel layer completely covers a surface of the copper structure facing the interposer substrate.

13. The integrated chip structure of claim 7, wherein the outermost sidewall of the copper structure is curved below the nickel layer.

14. The integrated chip structure of claim 13, wherein the nickel layer has an upper surface physically contacting the solder and a lower surface physically contacting the copper structure.

15. An integrated chip structure, comprising:
 a first substrate;
 an interposer substrate comprising one or more conductive routing layers;
 a copper bump between the first substrate and the interposer substrate, wherein the copper bump has a sidewall vertically surrounding a recess, as viewed in a cross-sectional view;
 a solder disposed on the copper bump and within the recess;
 a conductive structure disposed on the solder, the solder separating the copper bump from the conductive structure; and
 wherein the solder has a greater thickness along a first side of the copper bump than along an opposing, second side of the copper bump, as viewed in the cross-sectional view.

16. The integrated chip structure of claim 15, further comprising:
 a nickel layer disposed vertically between the copper bump and the solder, the nickel layer having a first width; and
 wherein the copper bump has a surface that faces away from the solder and that has a second width that is less than the first width.

17. The integrated chip structure of claim 16, wherein the solder has a third width that is greater than the first width.

18. The integrated chip structure of claim 15, wherein the conductive structure comprises copper.

19. The integrated chip structure of claim 15, wherein the solder completely fills the recess.

20. The integrated chip structure of claim 15, wherein the copper bump and the conductive structure have different widths.

* * * * *